United States Patent [19]
Irvine et al.

[11] 4,011,518
[45] Mar. 8, 1977

[54] MICROWAVE GaAs FET AMPLIFIER CIRCUIT

[75] Inventors: James A. Irvine, Clifton, N.J.; Peter Torrione, Astoria, N.Y.

[73] Assignee: The United States of America as represented by the Secretary of the Navy, Washington, D.C.

[22] Filed: Oct. 28, 1975

[21] Appl. No.: 626,162

[52] U.S. Cl. .................. 330/23; 330/31; 330/35; 330/40

[51] Int. Cl.² .......................... H03F 3/16

[58] Field of Search ............ 330/21, 22, 23, 31, 330/35, 40, 149

[56] References Cited

UNITED STATES PATENTS

| | | | |
|---|---|---|---|
| 3,382,445 | 5/1968 | Williams et al. | 330/23 |
| 3,514,710 | 5/1970 | Janning | 330/35 X |
| 3,517,325 | 6/1970 | Blackmer | 330/23 |
| 3,525,050 | 8/1970 | Wolf et al. | 330/35 X |
| 3,541,234 | 11/1970 | Austin | 330/35 UX |
| 3,716,730 | 2/1973 | Cerny | 330/35 X |

OTHER PUBLICATIONS

*Electronics*, Oct. 31, 1966, p. 19.
Ruth, "GaAs Diode Combines Gunn, Field Effects," *The Electronic Engineer*, Mar., 1967, p. 23.
Phalan, "Boost FET Amplifier Gains," *Electronic Design* 19, Sept. 13, 1967, pp. 98–102.

*Primary Examiner*—James B. Mullins
*Attorney, Agent, or Firm*—R. Sciascia; R. Beers; S. Sheinbein

[57] ABSTRACT

A network is coupled to the gate electrode of a FET for generating a negative gate electrode voltage having a selected nominal value for minimizing intermodulation distortion of the FET and/or a value varying with respect to the nominal value directly proportional to temperature changes to provide a constant gain for the FET.

11 Claims, 5 Drawing Figures

MICROWAVE GaAs FET AMPLIFIER CIRCUIT

BACKGROUND OF THE INVENTION

This invention relates to amplifier circuits and more particularly to microwave FET (field effect transistor) amplifier circuits.

SUMMARY OF THE INVENTION

An object of the present invention is to provide a microwave FET amplifier circuit to provide a constant gain for the FET with varying temperature and to minimize intermodulation distortion of the FET.

Another object of the present invention is to provide a microwave FET amplifier circuit to provide a constant gain for the FET with varying temperature.

A further object of the present invention is to provide a microwave FET amplifier circuit to minimize intermodulation distortion of the FET.

A feature of the present invention is the provision of a microwave FET amplifier circuit to provide a constant gain for the FET with varying temperature and to minimize intermodulation distortion of the FET comprising: a first source of radio frequency (RF) signal; a RF signal output; a second source of positive drain electrode operating voltage; a microwave FET having a gate electrode coupled to the first source, a drain electrode coupled to the output and the second source and a source electrode directly coupled to ground; and a network coupled to the gate electrode, the network generating a negative gate electrode voltage having a selected nominal value to minimize the intermodulation distortion and a value varying with respect to the nominal value directly proportional to temperature changes to provide the constant gain.

Another feature of the present invention is the provision of a microwave FET amplifier circuit to minimize intermodulation distortion of the FET comprising: a first source of RF signal; a RF signal output; a second source of positive drain electrode operating voltage; a microwave FET having a gate electrode coupled to the first source, a drain electrode coupled to the output and the second source and a source electrode directly coupled to ground; and a network coupled to the gate electrode, the network generating a negative gate electrode voltage having a selected value to minimize the intermodulation distortion.

A further feature of the present invention is the provision of a microwave FET amplifier circuit to provide a constant gain for the FET with varying temperature comprising: a first source of RF signal; a RF signal output, a second source of positive drain electrode operating voltage; a microwave FET having a gate electrode coupled to the first source, a drain electrode coupled to the output and the second source and a source electrode directly coupled to ground; and a network coupled to the gate electrode, the network generating a negative gate electrode voltage having a value varying directly proportional to temperature changes to provide the constant gain.

BRIEF DESCRIPTION OF THE DRAWINGS

Above-mentioned and other features and objects of this invention will become more apparent by reference to the following description taken in conjunction with the accompanying drawings, in which.

DESCRIPTION OF THE PREFERRED EMBODIMENT

Figure 1:
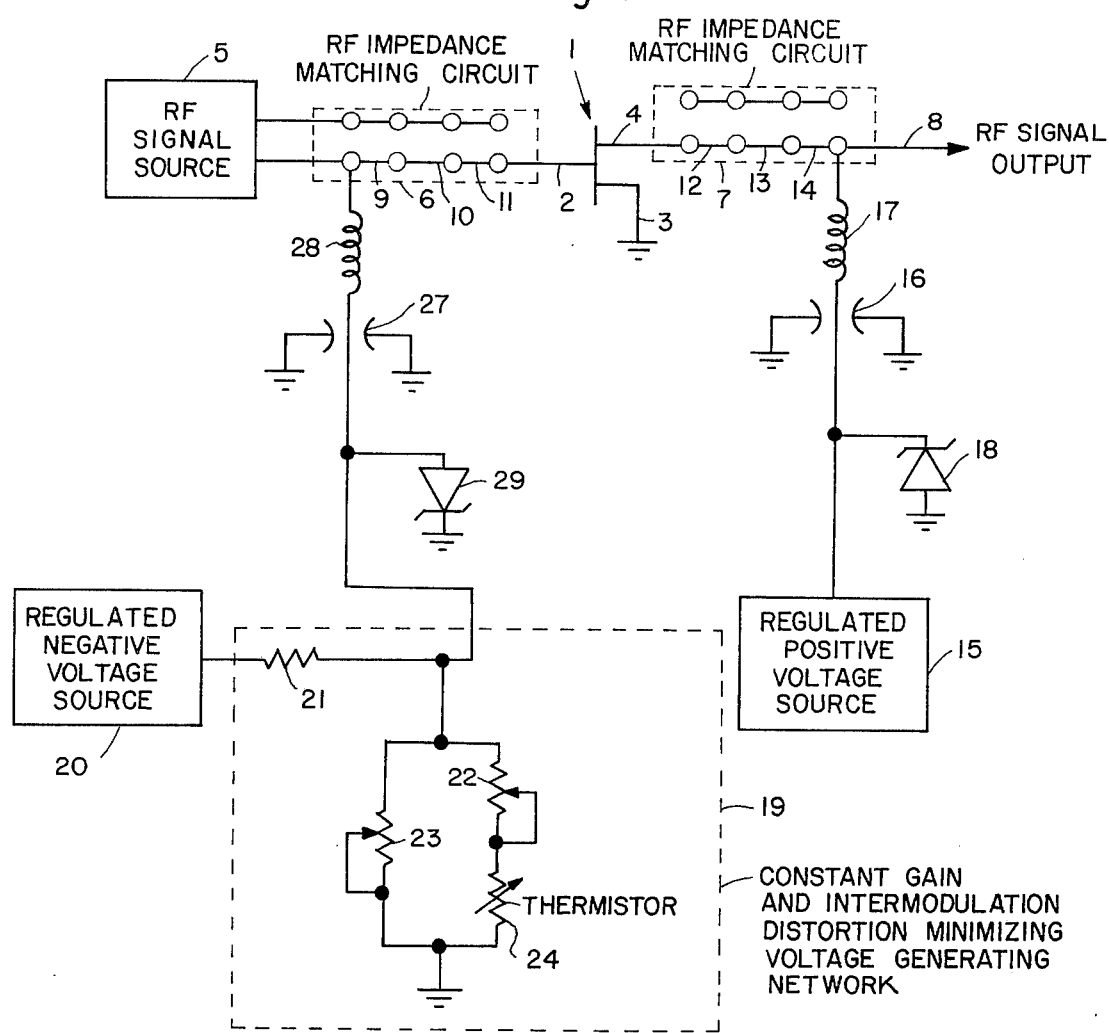
FIG. 1 is a schematic diagram partially in block form of a microwave FET amplifier circuit including a negative gate electrode voltage network for generating a voltage to provide simultaneously a constant gain and intermodulation distortion minimizing for the FET in accordance with the principles of the present invention.

Referring to FIG. 1, there is illustrated therein a microwave FET amplifier circuit in accordance with the principles of the present invention. The amplifier circuit includes a microwave n-channel GaAs FET 1 having a gate electrode 2, a source electrode 3 coupled directly to ground and a drain electrode 4. The RF signal to be amplified is applied from source 5 to a RF impedance matching circuit 6. The output of impedance matching circuit 6 is coupled to the gate electrode 2 of FET 1. A similar RF impedance matching circuit 7 is coupled between drain electrode 4 and the RF signal output 8.

Matching circuits 6 and 7 may include a plurality of coaxial line lengths, such as coaxial lines 9, 10 and 11 schematically illustrated in matching circuit 6. The length of coaxial lines 9–11 and the RF impedance of these lines are selected dependent on the RF impedance of source 5 and the RF impedance of the particular FET employed for FET 1 so as to obtain the desired RF impedance match. Similarly, coaxial lines 12, 13 and 14 of matching circuit 7 have their line lengths and RF impedances chosen dependent upon the RF impedance of FET 1 and the RF impedance of the circuit to which RF signal output 8 is coupled.

A positive operating voltage for drain electrode 4 is supplied by regulated positive voltage source 15, the output of which is coupled to a feedthrough capacitor 16 and hence to a RF choke 17. The positive drain electrode operating voltage is coupled from choke 17 through impedance matching circuit 7 to the drain electrode 4. Feedthrough capacitor 16 and RF choke 17 isolate source 15 from the RF signal. Zener diode 18 is coupled between the output of source 15 and ground for over voltage protection.

Figure 3:
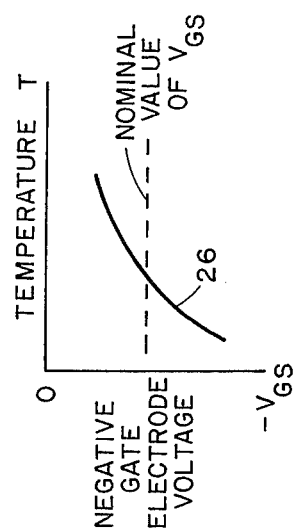
FIG. 3 is a graph of gate electrode voltage versus temperature useful in explaining the operation of the network of FIG. 1.
Figure 2:
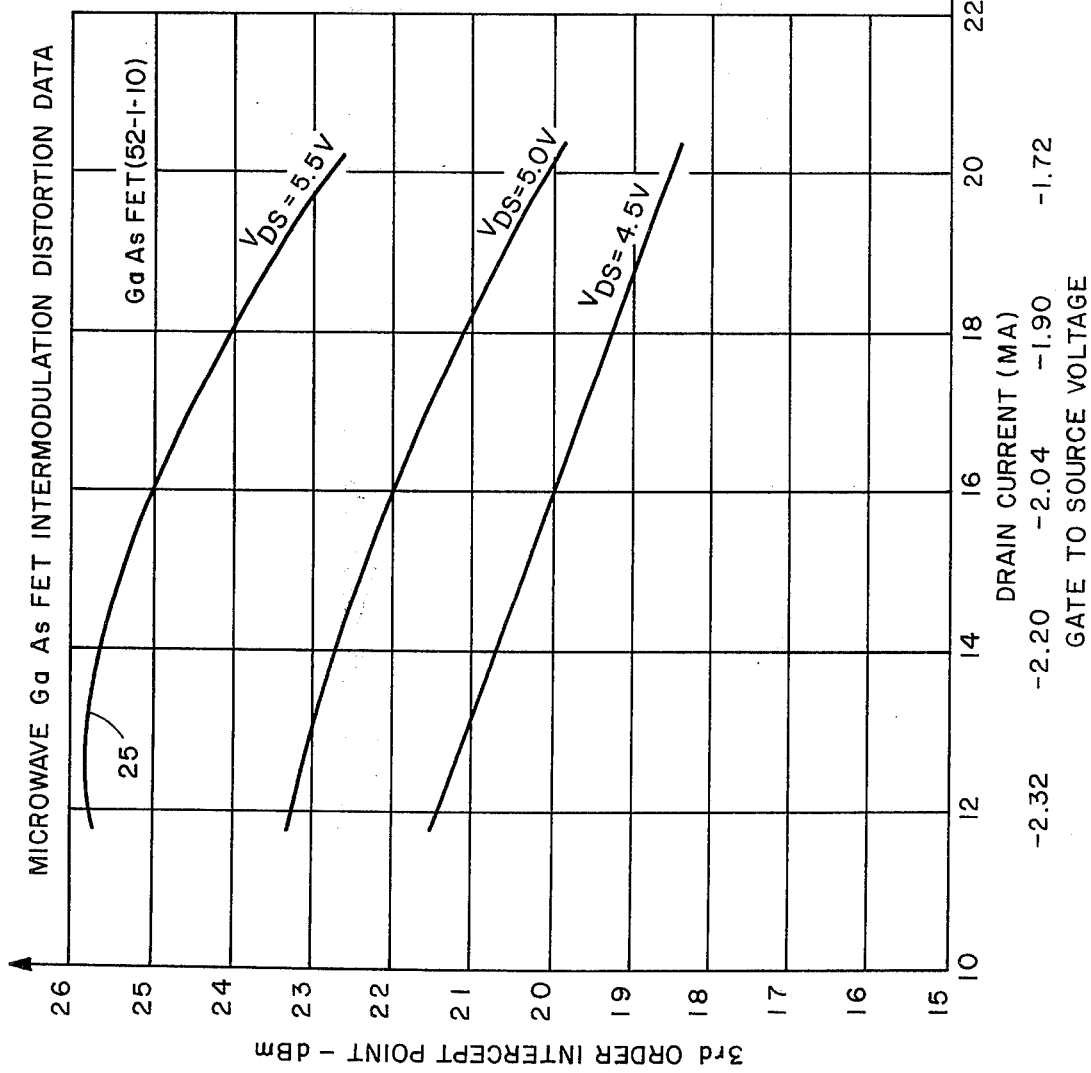
FIG. 2 is a graph illustrating data of the intermodulation distortion of a microwave GaAs (gallium arsenide) FET.

The constant gain and intermodulation distortion minimizing voltage generating network 19 provides a negative gate electrode voltage that will provide constant gain for FET 1 with varying temperature and also at the same time minimize intermodulation distortion of FET 1. As illustrated, network 19 receives a regulated negative voltage from source 20. One terminal of resistor 21 is coupled to the output of source 20 with the other terminal of resistor 21 being coupled to a resistive voltage divider circuit including variable resistors, such as potentiometers 22 and 23, and thermister 24. Potentiometers 22 and 23 are manipulated to select a nominal value for the gate electrode voltage $V_{GS}$. This nominal voltage $V_{GS}$ can be determined from the graph of FIG. 2. For instance, if FET 1 has 3rd order distortion products that are represented by the coordinate of the graph labelled 3rd order intercept points of just under 26 dBM and the drain electrode to source electrode voltage $V_{DS}$ is 5.5 volts a nominal voltage value of -2.25 volts as indicated at point 25 would be provided by potentiometers 22 and 23. As can be seen from the graph of FIG. 2, intermodulation distortion of an FET is minimized by selecting a gate electrode voltage $V_{GS}$ which minimized 3rd order distorting products. The selected nominal value of gate electrode voltage $V_{GS}$ is shown in the graph of FIG. 3 by the horizontal dash line. Thermister resistance 24 will vary with temperature as illustrated in the graph of FIG. 3 by the solid line 26. Thus, the voltage at the output of network 19 is a negative electrode voltage having a selected nominal value to minimize intermodulation distortion and a value varying with respect to the selected nominal value directly proportional to temperature changes to provide the desired constant gain for FET 1. This negative gate electrode output of network 19 is coupled through feedthrough capacitor 27, RF choke 28 and impedance matching circuit 6 to gate electrode 2. Feedthrough capacitor 27 and choke 28 isolate network 19 from the RF signal. Zener diode 29 is coupled between the output of network 19 and ground to provide over voltage protection.

Figure 4:
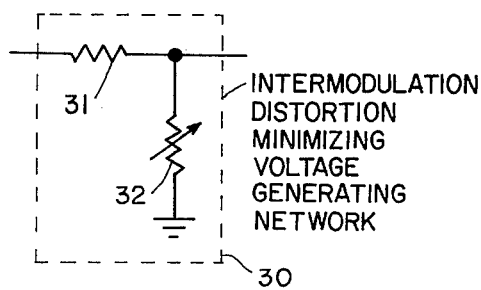
FIG. 4 is a voltage generating network to produce a gate electrode voltage to minimize intermodulation distortion of the FET that may be substituted for the network of FIG. 1.

Referring to FIG. 4 there is illustrated therein an intermodulation distortion minimizing voltage generating network 30 that may be substituted for network 19 of FIG. 1 where it is only desired to minimize intermodulation distortion of FET 1. Network 30 includes at least resistor 31 having one terminal coupled to source 20 with the other terminal coupled to a variable resistor 32. Variable resistor 32 will be manipulated to select the value of voltage generated by network 30 as determined from the data contained in the graph of FIG. 2.

Figure 5:
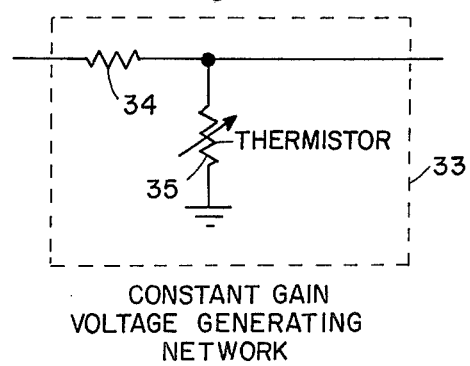
FIG. 5 is a schematic diagram of a voltage generating network that generates a gate electrode voltage that will provide a constant gain for the FET with varying temperature that may be substituted for the network of FIG. 1.

Referring to FIG. 5, a constant gain voltage generating network 33 may be substituted for network 19 of FIG. 1 where it is only desirable to provide constant gain for FET 1 with varying temperature. Network 33 includes resistor 34 having one terminal coupled to source 20 and the other terminal thereof coupled to thermister 35. Thermister 35 will produce a gate electrode voltage that varies with temperature as illustrated in FIG. 3 so as to maintain a constant gain for FET 1 with varying temperature.

While we have described above the principles of our invention in connection with specific apparatus it is to be clearly understood that this description is made only by way of example and not as a limitation to the scope of our invention as set forth in the objects thereof and in the accompanying claims.

We claim:

1. A microwave field-effect transistor (FET) amplifier circuit to provide a constant gain for said FET with varying temperature and to minimize intermodulation distortion of said FET comprising:
   a first source of radio frequency (RF) signal;
   a RF signal output;
   a second source of positive drain electrode operating voltage;
   a microwave FET having a gate electrode coupled to said first source, a drain electrode coupled to said output and said second source and a source electrode directly coupled to ground; and
   a network coupled to said gate electrode, said network generating a negative gate electrode voltage having a selected nominal value to minimize said intermodulation distortion and a value varying with respect to said nominal value directly proportional to temperature changes to provide said constant gain.

2. A circuit according to claim 1, wherein said selected nominal value is selected to minimize third order distortion products to enable minimizing said intermodulation distortion.

3. A circuit according to claim 1, wherein said microwave FET is a $n$-channel gallium arsenide microwave FET.

4. A circuit according to claim 3, further including a first RF impedance matching circuit coupled to said gate electrode, said first source and said network to couple said RF signal and said gate electrode voltage to said gate electrode.

5. A circuit according to claim 4, further including a first zener diode coupled between the output of said network and ground,
   a first feedthrough capacitor coupled to the output of said network, and
   a first RF choke coupled between said first feedthrough capacitor and the input of said first impedance matching circuit.

6. A circuit according to claim 5, further including a second RF impedance matching circuit coupled to said drain electrode, said second source and said output to couple said RF signal to said output and said drain electrode operating voltage to said drain electrode.

7. A circuit according to claim 6, further including a second diode coupled between the output of said second source and ground,
   a second feedthrough capacitor coupled to the output of said second source, and
   a second RF choke coupled between said second feedthrough capacitor and the output of said second impedance matching circuit.

8. A circuit according to claim 7, wherein said network includes
   a third source of regulated negative voltage,
   a resistor having one terminal coupled to the output of said third source,
   a first variable resistor coupled between the other terminal of said resistor and ground,
   a second variable resistor coupled to the other terminal of said resistor,
   said first and second variable resistor cooperating to select said selected nominal value,
   a third variable resistor having a resistance inversely proportional to temperature coupled in series with said second variable resistor and ground to provide said value varying with respect to said nominal value directly proportional to temperature changes.

9. A circuit according to claim 8, wherein said third variable resistor is a thermistor.

10. A circuit according to claim 1, wherein said network includes
    a third source of regulated negative voltage,
    a resistor having one terminal coupled to the output of said third source, a first variable resistor coupled between the other terminal of said resistor and ground, a second variable resistor coupled to the other terminal of said resistor, said first and second variable resistor cooperating to select said selected nominal value, a third variable resistor having a resistance inversely proportional to temperature coupled in series with said second variable resistor and ground to provide said value varying with respect to said nominal value directly proportional to temperature changes.

11. A circuit according to claim 10, wherein said third variable resistor is a thermistor.

* * * * *